(12) United States Patent
Kaddouri et al.

(10) Patent No.: US 10,528,197 B2
(45) Date of Patent: Jan. 7, 2020

(54) CURRENT CONVEYOR CIRCUIT, CORRESPONDING DEVICE, APPARATUS AND METHOD

(71) Applicant: STMicroelectronics S.r.l., Agrate Brianza (IT)

(72) Inventors: Danilo Karim Kaddouri, Pero (IT); Roberto Pio Baorda, Binasco (IT); Paolo Angelini, Bologna (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 21 days.

(21) Appl. No.: 15/689,908

(22) Filed: Aug. 29, 2017

(65) Prior Publication Data

US 2018/0284919 A1 Oct. 4, 2018

(30) Foreign Application Priority Data

Mar. 28, 2017 (IT) .................. 102017000034026

(51) Int. Cl.
*G06F 3/044* (2006.01)
*G06F 3/041* (2006.01)

(52) U.S. Cl.
CPC ............ *G06F 3/044* (2013.01); *G06F 3/0416* (2013.01)

(58) Field of Classification Search
CPC ...... G06F 3/044; G06F 3/0416; G06F 3/0418; G05F 3/10; H03F 3/347; H03F 3/45273; H03F 2200/91
See application file for complete search history.

(56) References Cited

U.S. PATENT DOCUMENTS

| 6,219,166 B1 | 4/2001 | Shang et al. |
| 8,928,624 B2 | 1/2015 | Singh et al. |
| 2013/0234685 A1* | 9/2013 | Thoka .................. G05F 1/561 |
| | | 323/282 |

(Continued)

FOREIGN PATENT DOCUMENTS

| CN | 106411279 A | 2/2017 |
| CN | 207397149 U | 5/2018 |
| EP | 0383397 A2 | 8/1990 |

OTHER PUBLICATIONS

Eloranta, Petri, et al., "Current Conveyors History, Theory, Applications and Implementation", Mar. 11, 2004, XP055432975, 42 pages.

(Continued)

*Primary Examiner* — Sahlu Okebato
(74) *Attorney, Agent, or Firm* — Slater Matsil, LLP

(57) ABSTRACT

A circuit includes a first transistor having a control terminal and a current path between first and second current path terminals. A second transistor has a control terminal and a current path between first and second current path terminals. The first current path terminal of the first transistor is coupled to the first current path terminal of the second transistor at an intermediate point. A first current buffer has an input and an output. The input of the first current buffer is coupled to the second current path terminal of the first transistor. A second current buffer has an input and an output, the input of the second current buffer being coupled to the second current path terminal of the second transistor. A summation node is coupled to the outputs of the first and second current buffer.

22 Claims, 5 Drawing Sheets

(56) References Cited

U.S. PATENT DOCUMENTS

| | | | |
|---|---|---|---|
| 2014/0071082 A1* | 3/2014 | Singh | G06F 3/044 |
| | | | 345/174 |
| 2014/0071188 A1* | 3/2014 | Oh | G09G 3/3696 |
| | | | 345/691 |
| 2015/0102827 A1* | 4/2015 | Byun | G06F 3/044 |
| | | | 324/679 |
| 2016/0026295 A1 | 1/2016 | Ogirko et al. | |
| 2018/0006620 A1* | 1/2018 | Kauffman | H03F 3/195 |

OTHER PUBLICATIONS

Metin, Bilgin, et al., "Enhanced dynamic range analog filter topologies with a notch/all-pass circuit example", Analog Integrated Circuits and Signal Processing, vol. 51, Jul. 27, 2007, XP019523200, pp. 181-189.

Bruun, Erik, "Noise Properties of CMOS Current Conveyors", 1996 IEEE International Symposium on Circuits and Systems, vol. 1, Denmark, pp. 144-147.

Elwan, Hassan O., et al., "Low-Voltage Low-Power CMOS Current Conveyors", IEEE Transactions on Circuits and Systems—I: Fundamental Theory and Applications, vol. 44, No. 9, Sep. 1997, pp. 828-835.

Surakampontorn, Wanlop, et al. "Accurate CMOS-based Current Conveyors", IEEE Transactions on Instrumentation and Measurement, vol. 40, No. 4, Aug. 1991, pp. 699-702.

Stmicroelectronics, "Ultra low-power capacitive multi-touch screen controller for 2" to 13" screens", Doc ID 328206, Rev. 1, Aug. 2015, pp. 1-5.

Mahmoud, S.A., et al., "Digitally controlled fully differential current conveyor: CMOS realization and applications", IEEE International Symposium on Circuits and Systems (ISCAS) May 23-26, 2005 Kobe, Japan pp. 1622-1625.

\* cited by examiner

CURRENT CONVEYOR CIRCUIT, CORRESPONDING DEVICE, APPARATUS AND METHOD

CROSS-REFERENCE TO RELATED APPLICATIONS

This application claims priority to Italian Application No. 102017000034026, filed on Mar. 28, 2017, which application is hereby incorporated herein by reference.

TECHNICAL FIELD

The description relates to current conveyor circuits.

BACKGROUND

Current conveyors circuits are suited to be used in various operational contexts.

By way of example, current conveyors are useful in providing a building block of the analog front end of touch screen controllers, for instance in those situations where it is desired to read a set of sensing capacitors. Touch screen controllers have been recently introduced, e.g. for use in mobile devices, which may provide true multi-touch capability, supporting virtually unlimited simultaneous touches. The FingerTip® family of controllers developed by the applicant company are exemplary of such controllers.

Documents such as:
W. Surakampontorn, et al.: "Accurate CMOS-based Current Conveyors" IEEE TRANSACTIONS ON INSTRUMENTATION AND MEASUREMENT, VOL. 40. NO. 4. AUGUST 1991, pp. 699-702;
Erik Bruun: "Noise Properties of CMOS Current Conveyors, Proceedings of the 1996 IEEE International Symposium on Circuits and Systems. Vol. 1 IEEE, 1996. p. 144-147;
H. O. Elwan et al.: "Low-Voltage Low-Power CMOS Current Conveyors", IEEE TRANSACTIONS ON CIRCUITS AND SYSTEMS—I: FUNDAMENTAL THEORY AND APPLICATIONS, VOL. 44, NO. 9, SEPTEMBER 1997, pp. 828-835;
S. A. Mahmoud, et al.: "Digitally controlled fully differential current conveyor: CMOS realization and applications", IEEE International Symposium on Circuits and Systems (ISCAS) May 23-26, 2005 Kobe, Japan pp. 1622-1625;
EP 0 383 397 B1
are exemplary of the extensive activity devoted over the years to current conveyor circuits.

SUMMARY

One or more embodiments may apply to current conveyor circuits which may be used in touch-screen controllers.

Despite intensive activity, a demand is still felt for improved current conveyor arrangements, for instance as regards one or more of the following features: input voltage dynamic range higher than in conventional push-pull source follower current conveyors, reduced output current noise, and/or low power consumption. One or more embodiments can contribute in meeting such a demand.

One or more embodiments may relate to a corresponding device (for instance, a touch-screen controller) and apparatus (for instance, mobile communication apparatus) as well as to a corresponding method.

One or more embodiments may provide capacitance-to-charge conversion based on a current conveyor concept, for instance for touch-screen controllers.

One or more embodiments may implement a current conveyor transfer function with the capability of operating with high capacitance connected to the "x" input pin and with a wide dynamic range on the input pins, together with low transconductance output providing a reduced output current noise.

One or more embodiments may adopt a push-pull source follower solution, with the signal current folded on the output transistors through cascade transistors.

One or more embodiments, output transistors can be biased independently of the input source follower transistors by means of current generators, with a folded current mirrored to the output node.

One or more embodiments may avoid the use of diode connected transistor, which were found to contribute to diminished input voltage dynamics.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
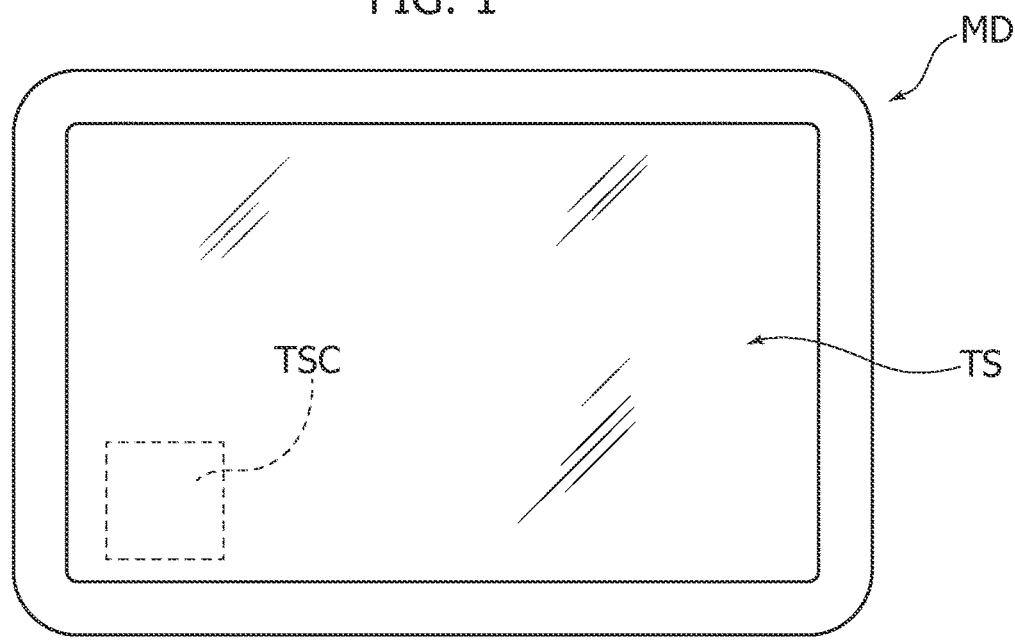
FIG. 1 is exemplary of possible contexts of use of embodiments.

FIG. 1 is exemplary of a possible context of use of embodiments, namely a mobile (for instance, communication) device such as a smartphone, a tablet, and a laptop computer—this list being merely exemplary and not limitative—including a touch screen TS with a touch screen controller TSC, providing for instance multi-touch capability, supporting unlimited simultaneous touches.

According to an arrangement known per se (which makes it unnecessary to provide a more detailed description herein) a current conveyor may be included as a building block of such a controller TSC. For instance, a current conveyor may be included in the analog front end of a touch screen controller to provide the capability of reading a set of sensing capacitors.

Of course, reference to this possible context of use is merely exemplary and thus non-limiting of the scope of the embodiments.

Figure 2:
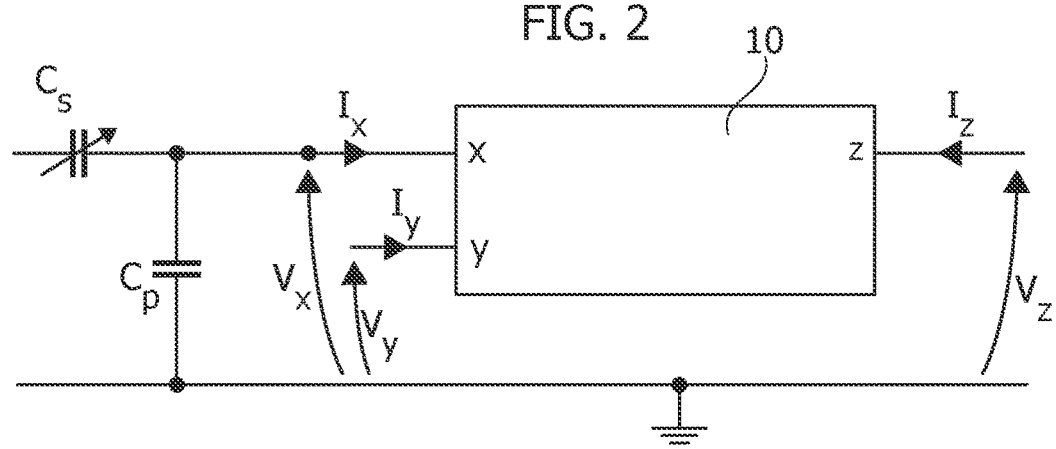
FIGS. 2 and 3 are general representations of a current conveyor and its mode of operation.

As shown in FIG. 2, a current conveyor 10 may be used together with a capacitive sensing element $C_S$ having a variable capacitance value. In FIG. 2, the capacitance $C_P$ is a (large) parasitic capacitor, which for the sake of simplicity will be assumed to be grounded throughout this description.

The arrangement of FIG. 2 may be intended to "translate" the value of $C_S$ into a corresponding amount of charge and to transfer it as a current $I_z$ at a node z of the current conveyor 10. This result can be achieved by voltage driving the sensing capacitor $C_S$ and by using the current conveyor 10 to read the charge stored on the sensing capacitor $C_S$ and transfer it to the node z.

For that purpose, the current conveyor 10 may be configured to have a low impedance at a first input x and high impedances at a second input y and at the terminal z, with the current sunk or sourced at the terminal x transferred to the z terminal with a magnification factor M.

Operation of the current conveyor may be described in compact form by using a matrix form, namely:

$$\begin{pmatrix} I_y \\ V_x \\ I_z \end{pmatrix} = \begin{pmatrix} 0 & 0 & 0 \\ 1 & 0 & 0 \\ 0 & M & 0 \end{pmatrix} \begin{pmatrix} V_y \\ I_x \\ V_z \end{pmatrix}$$

Figure 3:
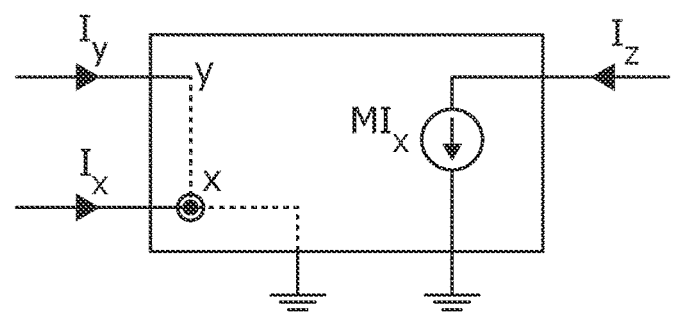

A circuit model of a current conveyor described by the previous matrix equation is given in FIG. 3, with the dotted line between terminals x and y representing a virtual short circuit: that is, the voltage drop between the two terminals is zero and no current flows between them. The dotted line between terminal x and ground represents a virtual ground: that is, the current applied at this terminal is sunk by the ground, but the terminal voltage is not zero (indeed, it is equal to that of terminal y).

Figure 4:
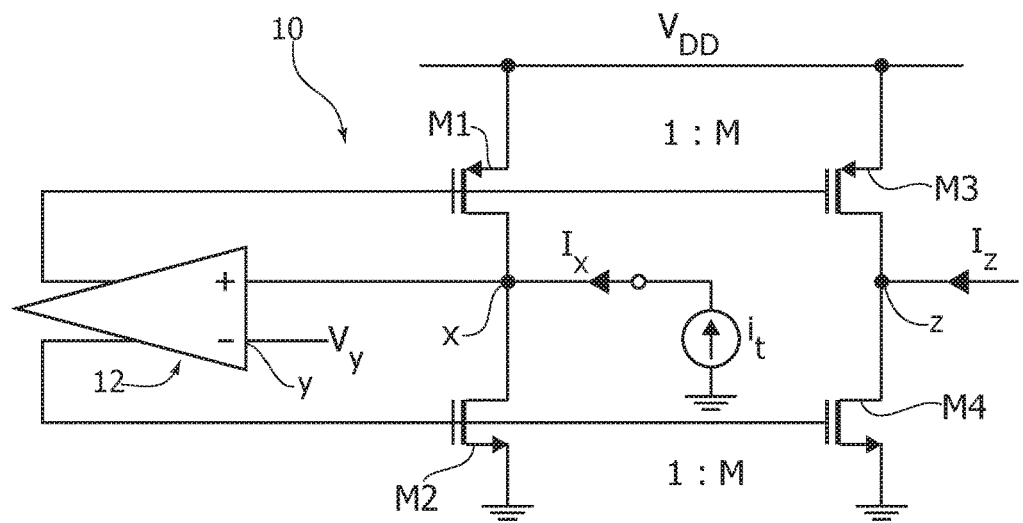
FIGS. 4 and 5 are circuit diagrams of current conveyors.
Figure 5:
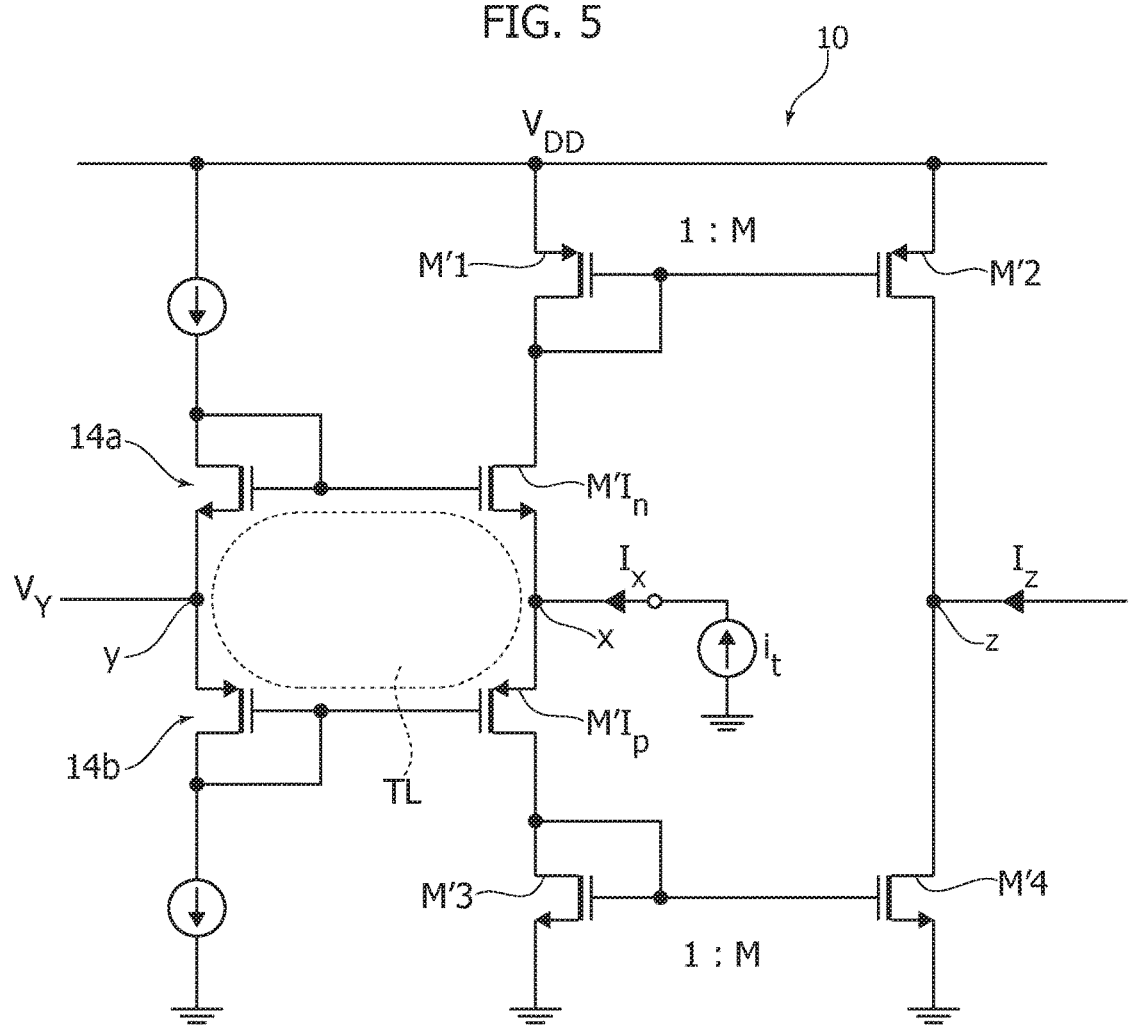

The current $I_z$ at the output terminal z is provided by an ideal (i.e. infinite shunt resistance) current controlled current generator with a gain factor M with respect to the input current $I_x$, that is $I_z=MI_x$ One or more embodiments may relate to possible implementations of such a circuit, with FIGS. 4 and 5 exemplary of conventional approaches for that purpose.

FIG. 4 is exemplary of a current conveyor circuit 10 based on a buffer-connected OTA (Operational Transconductance Amplifier) 12 having a first (for instance inverting) input y coupled to $V_y$ and a second (for instance, non-inverting) coupled to an intermediate point between two transistors M1, M2 (such as MOSFET transistors of complementary polarities, e.g. PMOS and NMOS) having their current paths (source-drain, in the case of a FET such as a MOSFET) arranged in series between a supply line $V_{DD}$ and ground.

A current $I_z$ from a current source $i_t$ is present at the captioned intermediate point (input x), with two further transistors M3, M4 (again, for instance, MOSFET transistors of complementary polarities, e.g. PMOS and NMOS) having their current paths arranged in series between a supply line $V_{DD}$ and ground to form with the transistors M1, M2 a 1:M current mirror in order to provide a current $I_z$ at an intermediate point between the transistors M3 and M4 (terminal z).

FIG. 5 is exemplary of a current conveyor circuit 10 based on a push-pull source follower arrangement including a translinear loop configuration, that is a loop applying the translinear principle, namely a closed loop containing an even number of translinear elements (TEs) with an equal number of them arranged clockwise and counter-clockwise, the product of the currents through the clockwise TEs being equal to the product of the currents through the counter-clockwise TEs.

The circuit of FIG. 5 includes a first pair of transistors 14a, 14b (again, these may be MOSFET transistors of complementary polarities, e.g. PMOS and NMOS having their current paths arranged in series between a supply line $V_{DD}$ and ground) in a diode configuration (gate shorted to drain) with the signal $V_y$ at an intermediate point therebetween (input y), and a second pair 16 of transistors $M'_{In}$, $M'_{Ip}$ (again, these may be MOSFET transistors of complementary polarities, e.g. PMOS and NMOS) having their gates coupled with the gates of the transistors 14a, 14b of the first pair with the signal $I_x$ from a current source $i_t$ at the intermediate point therebetween (input x).

The current paths (source-drain in the case of field effect transistors such as MOSFETs) of the transistors $M'_{In}$, $M'_{Ip}$ are arranged in series between a supply line $V_{DD}$ and ground with the current paths of two further transistors M'1 and M'3 in a diode configuration (gate shorted to drain).

The gates of these latter transistors are in turn coupled to the gates of two further transistors M'2 and M'4 to provide (as in the case of the transistors M3 and M4 of FIG. 4) a current mirror with a factor 1:M with a current $I_z$ as discussed previously at an intermediate point (terminal z) between the transistors M'3 and M'4.

The solution of FIG. 4 implements a current conveyor wherein, thanks to the negative feedback (short circuit between the x terminal and the non-inverting input of the operational amplifier 12) the input terminal x is a low impedance node and is virtually shorted to terminal y. Moreover, if a current $i_t$ is injected into terminal x the feedback loop will react by adjusting the gate-to-source voltage of transistors M'1 and M'3 or M'2 and M'4: thus, a magnified replica of current $i_t$ will be sourced or sunk (depending on the sign of current $i_t$) at the output terminal z.

It was observed that a solution as exemplified in FIG. 4 may give rise to issues related to the stability of the amplifier and the trade-off between stability and current consumption. In fact, with a large capacitance $C_P$ connected to the x terminal and the operational amplifier 12 buffer-connected, the transconductance $g_m$ of transistors M'1 and M'2 should be large enough to facilitate achieving the stability of the circuit. This means that, in order to avoid that compensation for circuit stability may become difficult, the value of $g_m$ for transistors M'1 and M'2 cannot be selected arbitrarily small. A large $g_m$ may in turn lead to a larger current noise insofar as a larger output current noise may be generated due to the output branch (transistors M'3 and M'4) being a "magnified" replica of the input branch (transistors M'1 and M'2). Moreover, facilitating circuit stability may involve using large compensation capacitors.

A relationship between the parameters concerned may be expressed as follows:

$$(g_{mout}/g_{min}) \cdot (C_C/C_P) = K_\Phi$$

Here:

$g_{mout}$ and $g_{min}$ represent the transconductances of the output and input stages, respectively;

$C_P$ is representative of a (parasitic) capacitor connected at the input terminal x;

$C_C$ is the value of the two Miller capacitors which are used in order to compensate the circuit;

$K_\Phi$ is a parameter related to the phase margin: for instance, in order to obtain a 60-degree phase margin, $K_\Phi$ may be selected to be about 2.2.

The relationship above is representative of the interplay between stability considerations, current consumption and area occupation.

Moreover, the noise introduced by the OTA input stage 12 may contribute appreciably to the total current conveyor noise.

In the arrangement of FIG. 5, which also implements a current conveyor, a current $i_t$ applied at terminal x will be mirrored and made available at the terminal z so that an adequate design of the current mirrors 1:M will provide a desired magnification M. Moreover, the loop TL indicated in the circuit scheme is a translinear loop which facilitates correct biasing of the input terminal x.

It was observed that a disadvantage of the arrangement of FIG. 5 may lie in the input voltage dynamics and the trade-off between input voltage dynamics and noise.

Saturating the transistors M'$_{In}$ and M'$_{Ip}$ facilitates a correct behavior of the circuit and, by considering the input branch of the circuit of FIG. 5, saturation of the transistors in question may occur in compliance with the following relationship:

$$V_{GS3}+V_{oVP} \leq V_X \leq V_{DD}-V_{SG1}-V_{oVN}$$

where:

$V_{GS3}$ and $V_{SG1}$ indicate the gate-source and source-gate voltages of the diode-connected transistors M'3 and M'1, respectively;

$V_{DD}$ is the supply voltage of the circuit;

$V_{oVP}$ and $V_{oVN}$ indicate the overdrive voltages of the transistors M'$_{Ip}$ and M'$_{In}$, respectively.

The previous relationship shows that, in the presence of a small supply voltage ($V_{DD}$), the input dynamics represents a point deserving attention.

Smaller transistor overdrives make it larger, this suggesting reducing transistor overdrive voltages. This is in contrast with circuit noise requirements, since the noise contribution of the transistors M'1 and M'3 will be reduced by reducing their $g_m$, this however resulting in their overdrive voltage being increased.

Another disadvantage of the arrangement of FIG. 5 may lie in the fact that a magnified replica of the input branch current flows in the output branch. Increasing the input current facilitates reducing the input impedance while however producing an increased current consumption.

One or more embodiments may be based on the recognition of the advantage of avoiding, in providing the current sources M'1 and M'3, the use of diode connected transistor, which contributes to a diminished input voltage dynamics. In fact, their contributions to the input supply dynamics lie in the terms $V_{GS3}$ and $V_{SG1}$ introduced previously.

It was observed that the following relationships apply:

$$V_{GS3}=V_{OV3}+V_{THN}$$

$$V_{SG1}=V_{OV1}+|V_{THP}|$$

where:

$V_{THN}$ and $V_{THP}$ are the threshold voltages of M'3 and M'1, respectively $V_{OV1}$ and $V_{OV3}$ are the overdrive voltages of M'1 and M'3, respectively with the "real" limitation lying in the threshold voltages which reduce the input voltage dynamics (for instance by about 1.3V).

One or more embodiments may thus adopt the layout exemplified in FIG. 6 where parts or elements already discussed in connection with FIG. 5 are indicated with the same references appearing in FIG. 5, thus making it unnecessary to repeat the related description.

Figure 6:
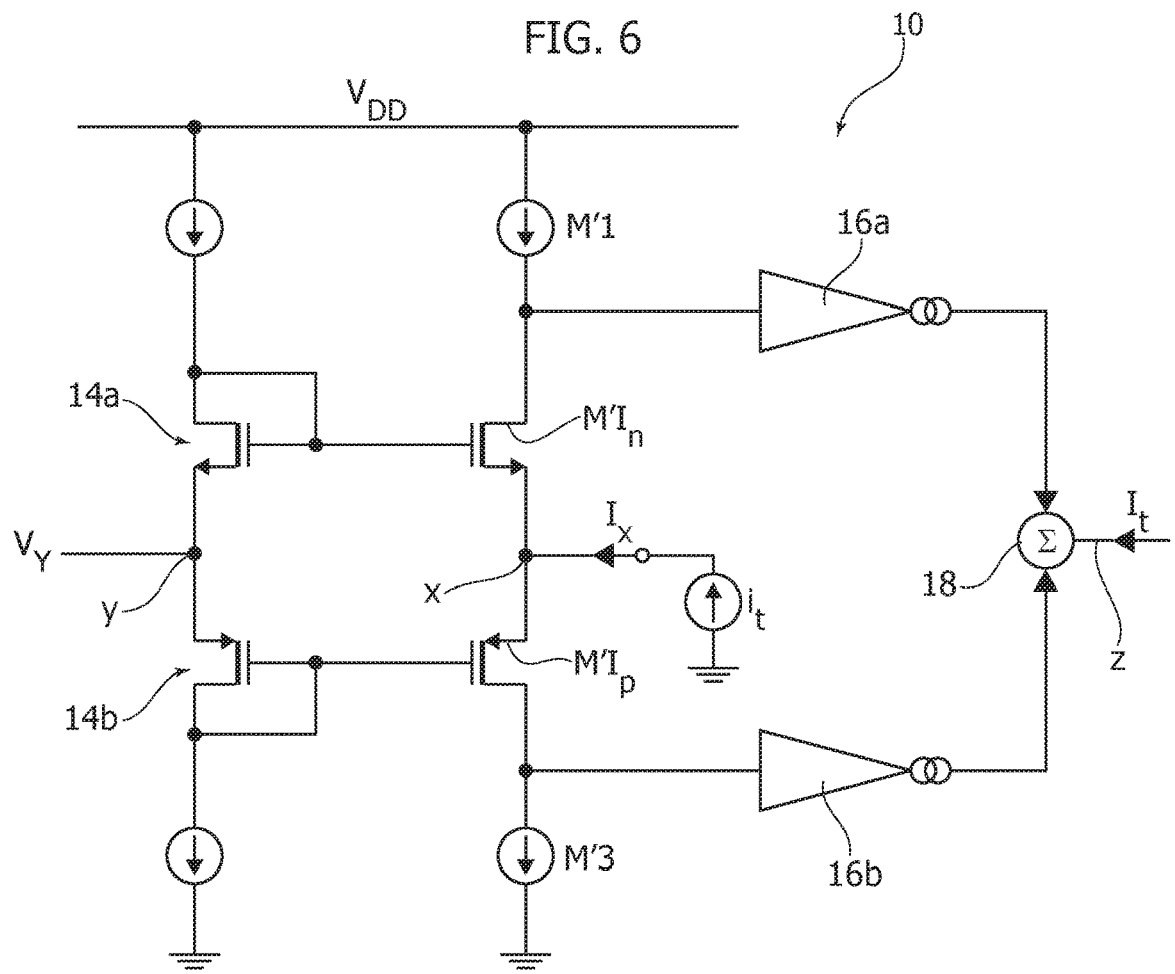
FIG. 6 is a circuit diagram exemplary of embodiments.

In one or more embodiments as exemplified in FIG. 6, the signal $i_t$ in the input branch is, so-to-say, forced to pass through two current buffers 16a, 16b which lead it towards an output summation node 18 at the terminal z.

In one or more embodiments as exemplified in FIG. 6, the two diode-connected transistors M'1 and M'3 may be replaced by two current generators (the same designation is maintained for immediate reference) which facilitate a correct biasing of the input branch.

In one or more embodiments as exemplified in FIG. 6, the following relationship applies to the dynamics of the input voltage $V_X$:

$$V_{OV3}-V_{OVP} \leq V_X \leq V_{DD}-V_{OV1}-V_{OVN}$$

where:

$V_{oVP}$ and $V_{oVN}$ indicate the overdrive voltages of M'$_{Ip}$ and M'$_{In}$, respectively $V_{OV3}$ and $V_{OV1}$ indicate the overdrive voltages of M'3 and M'1, respectively $V_{DD}$ is the supply voltage of the circuit so that the limiting contribution due to the threshold voltages is no longer present.

Figure 7:
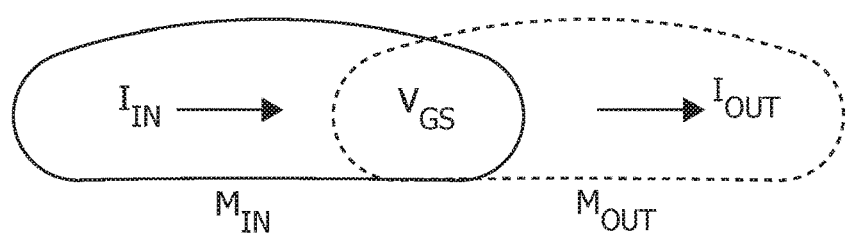
FIGS. 7 to 10 are explanatory diagrams.
Figure 8:
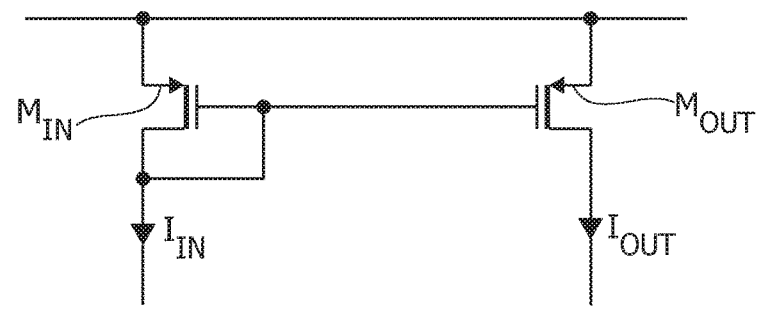

A better insight into one embodiment may be gathered by noting that a diode-connected transistor may be seen as a current-to-voltage converter so that (as schematically represented in FIGS. 7 and 8) a first diode-connected transistor $M_{IN}$ converts a current $I_{IN}$ into a voltage and then a second transistor $M_{OUT}$ converts the voltage into a current $I_{OUT}$. It was observed that such a double conversion is redundant and, involving a diode connected transistor, limits the input voltage dynamics.

One or more embodiments as exemplified in FIG. 6 avoid such a redundancy by routing the signal component $i_t$ of the input current towards the node z by using two current buffers such as 16a and 16b.

Figure 9:
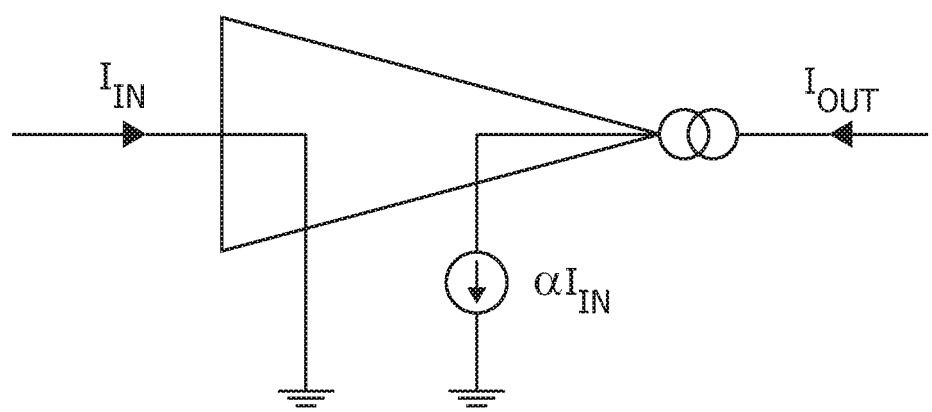

As exemplified in FIG. 9, a current buffer includes a circuit with a low (ideally zero) impedance at an input with an input current $I_{IN}$ and large (ideally infinite) impedance at an output with an output current $I_{OUT}=\alpha I_{IN}$. The current-controlled current source amplification parameter $\alpha$ equals 1 for a current buffer, but a larger factor can be chosen in order to get some gain, thus obtaining a current amplifier.

Figure 10:
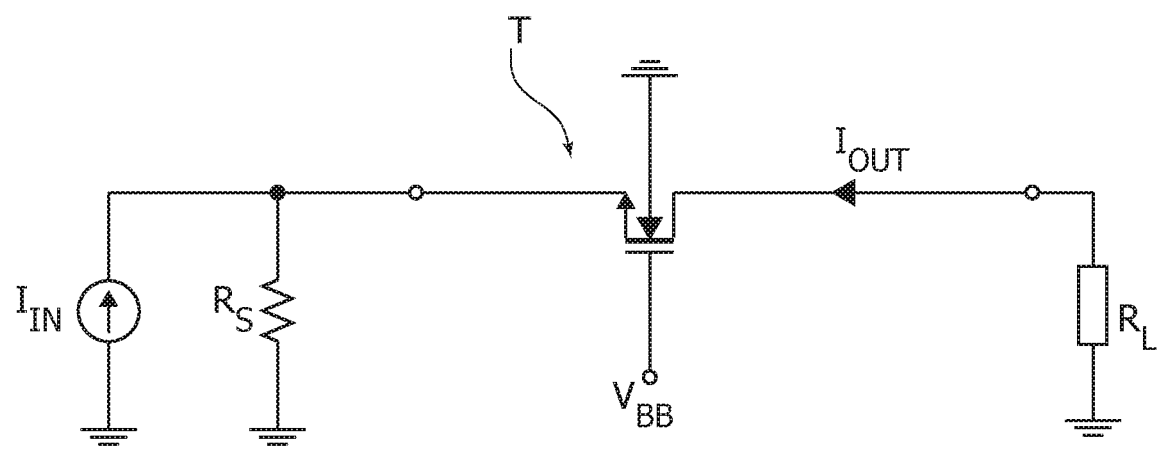

A current buffer may be implemented using a common gate connected transistor T (e.g., a MOSFET), as shown in FIG. 10. Here RS represents the equivalent shunt resistance of the current generator providing the input current IIN (ideally RS should approach infinity) and RL is the resistance of a load through which the out current IOUT flows. A correct transistor biasing (voltage VBB) may be facilitated by resorting to suitable circuitry as known to those skilled in the art.

The current gain $A_I$ of a stage as exemplified in FIG. 10 can be expressed as follows:

$$A_I=[R_s(g_m+g_o)]/[1+R_S(g_m+g_o)+R_L g_o]$$

where:

$R_s$ and $R_L$ are the current source shunt resistance and the load resistance, respectively, $g_m$ and $g_o$ are the transconductance and output conductance of the transistor indicated as T.

The gain AI approaches unity if $R_S$ is large enough, which may reasonably apply in an arrangement as exemplified in FIG. 6, where the circuit facilitates achieving a low input impedance and a large output impedance.

Figure 11:
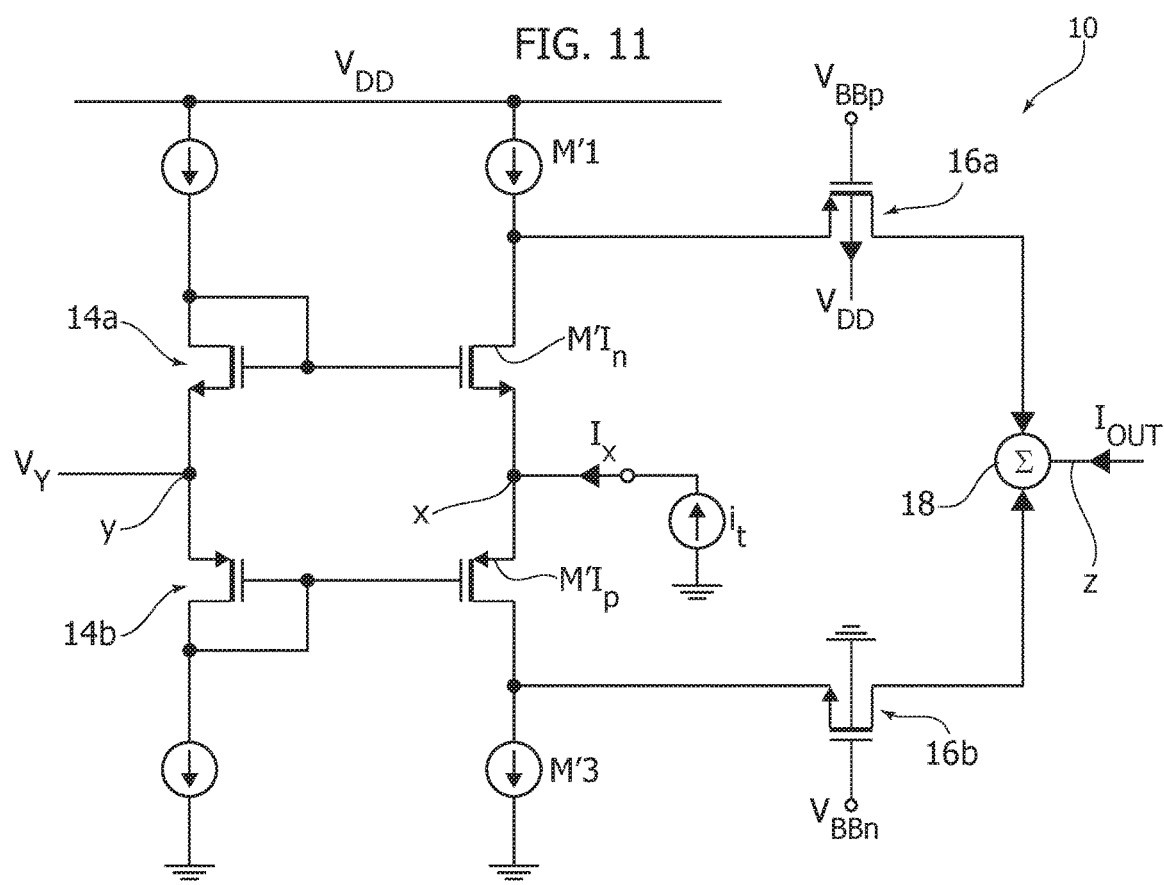
FIGS. 11 and 12 are circuit diagrams exemplary of embodiments.
Figure 12:
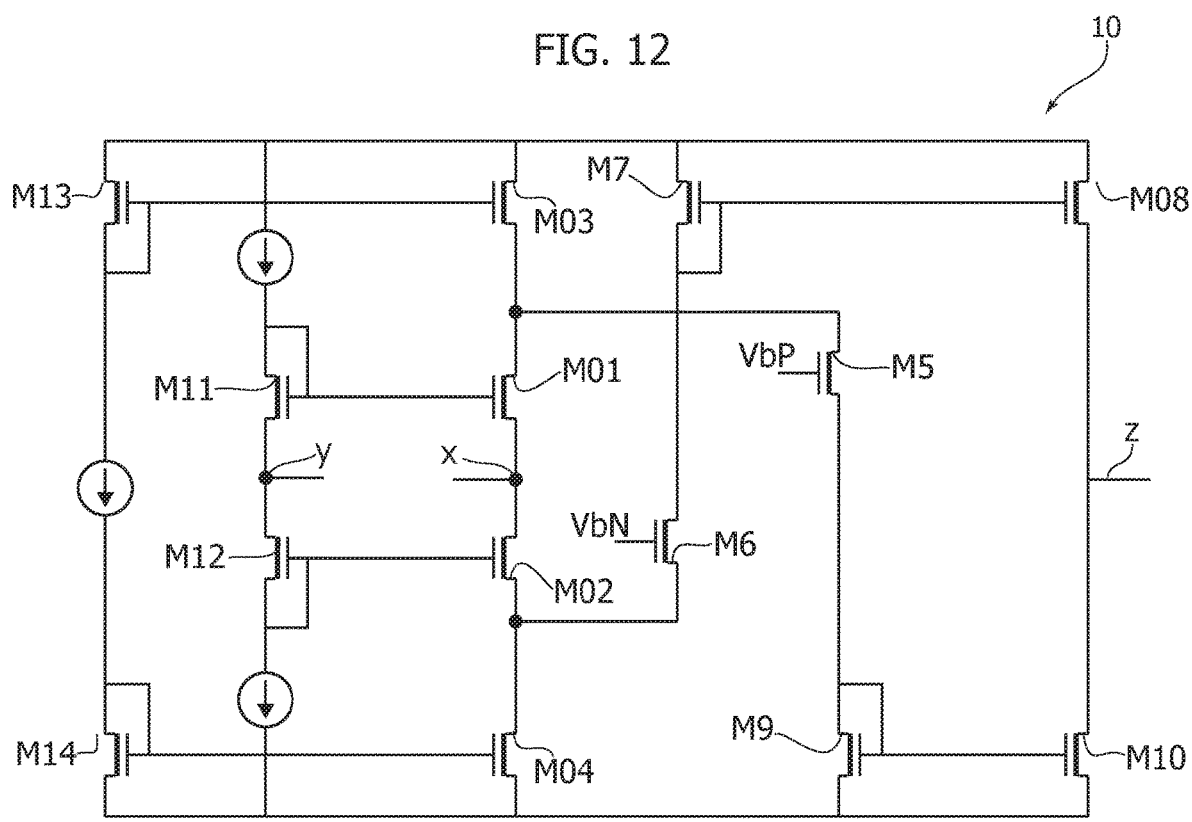

FIGS. 11 and 12 (where parts or elements already discussed in connection with FIGS. 5 and 6 are indicated with the same references, thus making it unnecessary to repeat the related description) exemplify practical implementations of one or more embodiments.

FIG. 11 exemplifies a possible implementation of the current buffers 16a, 16b by resorting to gate connected transistors as discussed previously in connection with in FIG. 10, with biasing voltages $V_{BBN}$ and $V_{BBP}$.

FIG. 12 exemplifies possible embodiments where the summation node 18 may be implemented by using two current mirrors with mirror ratio equal to M:1. It was noted that here the presence of two diode-connected transistors is not a concern since these diode-connected transistors will not affect either the input voltage or the output voltage dynamics.

Specifically, the representations of FIGS. 6 and 11 are translated in the transistor-level representation of FIG. 12 as follows:

transistors 14a, 14b of FIGS. 6 and 11>>>transistors M11, M12 of FIG. 12;

transistors $M'_{In}$, $M'_{Ip}$ of FIGS. 6 and 11>>>transistors M01, M02 of FIG. 12;

generators M'1, M'3 of FIGS. 6 and 11>>>transistors M03, M13 and M04, M14 of FIG. 12;

buffers/transistors 16a, 16b of FIGS. 6 and 11>>>transistors M5, M6 of FIG. 12;

summation node 18 of FIGS. 6 and 11>>>current mirrors M7, M8 and M9, M10 of FIG. 12.

In one or more embodiments current consumption may no longer represent a concern because the input and output branches are decoupled: therefore a current consumption-input voltage dynamics trade-off no longer comes into play.

Another advantage of one or more embodiments may lie in that the current flowing in the output branch can be reduced in order to reduce the noise contribution of the output transistors.

While discussed in detail for ease and completeness of understanding of the embodiments, the arrangement of the (second) pair of transistors 14a, 14b providing at their intermediate point a second input terminal y of the circuit as described herein is not mandatory, and other arrangements may be adopted in one or more embodiments.

For instance, this may be the case for certain differential current conveyor arrangements as discussed in a co-pending Italian Patent Application No. 102017000034042, filed on Mar. 28, 2017, by the same Applicants and including:

plural single-ended current conveyors having respective "x" terminals (e.g. X1, X2, . . . Xn) with respective input transistor pairs MiN, MiP corresponding to the transistor pair $M'_{In}$, $M'_{Ip}$ discussed herein, and a common bias circuit including a single pair of transistors corresponding to the transistor pair 14a, 14b discussed herein coupled via reset switches SW1, SW2.

One or more embodiments may concern a circuit (e.g. 10) including:

a pair of transistors (e.g. $M'_{In}$, $M'_{Ip}$) arranged with their current paths (e.g. source-drain, in the case of field effect transistors such as MOSFETs) in series and coupled at an intermediate point between the transistors of the pair of transistors, the intermediate point including an input terminal (e.g. x) of the circuit, wherein the circuit includes:

a pair of current buffers (e.g. 16a, 16b) having respective inputs and outputs, the inputs of the current buffers of the pair of current buffers coupled to the current paths of the transistors of the pair of transistors opposite said intermediate point, and a summation node (e.g., 18) coupled to the outputs of the current buffers of the pair of current buffers, the output of the summation node including an output terminal (e.g., z) of the circuit.

One or more embodiments may include a further pair of transistors (e.g., 14a, 14b) arranged with their current paths in series and coupled at a further intermediate point between the transistors of the further pair of transistors, the further intermediate point including a further input terminal (e.g. y) of the circuit, wherein the transistors of the further pair of transistors have control terminals (e.g. gates, in the case of field effect transistors such as MOSFETs) coupled to the control terminals of the transistors of said pair of transistors (e.g. in a translinear loop).

One or more embodiments may include first and second bias generators (e.g. M'1, M'3) active on the current paths of the transistors of said pair of transistors, wherein the current buffers of the pair of current buffers have their respective inputs coupled between:

the first bias generator (e.g., M'1) and one (e.g., $M'_{In}$) of the transistors of the pair of transistors, the second bias generator (e.g., M'3) and the other (e.g., $M'_{Ip}$) of the transistors of the pair of transistors.

In one or more embodiments, the current buffers may include common gate connected transistors.

In one or more embodiments the summation node may include current mirrors (e.g. M7, M8; M9, M10) coupled with the outputs of the current buffers of the pair of current buffers.

In one or more embodiments the current mirrors may include diode-connected transistors.

In one or more embodiments the pair of transistors and/or the further pair of transistors may include paired transistors of opposing polarities (e.g. NMOS and PMOS).

A device (e.g. TSC) according to one or more embodiments may include the circuit (e.g., 10) of one or more embodiments and a sensing capacitor (e.g., $C_S$) coupled with the first input of the circuit. A current indicative of the value of the sensing capacitor is available at the output terminal of the circuit.

One or more embodiments may include a circuit according to one or more embodiments, with a further capacitor (e.g. a parasitic capacitor $C_P$) coupled with a further input terminal (e.g. y) of the circuit.

A device according to one or more embodiments may include a touch screen controller (e.g. TSC).

In one or more embodiments, apparatus (e.g. MD) including a device according to one or more embodiments may be sensitive to the value of said sensing capacitor available at the output terminal of said circuit in said device.

In one or more embodiments, a method may include:

providing a device according to one or more embodiments, sensing the value of said sensing capacitor available at the output terminal of said circuit in said device.

Without prejudice to the underlying principles, the details and embodiments may vary, even significantly, with respect to what has been disclosed by way of example only, without departing from the extent of protection.

The extent of protection is defined by the annexed claims.

What is claimed is:

1. A circuit, comprising:
  a first transistor having a control terminal and a current path between first and second current path terminals;
  a second transistor having a control terminal and a current path between first and second current path terminals, the first current path terminal of the first transistor coupled to the first current path terminal of the second transistor at an intermediate point;
a first current buffer having an input configured to receive a first input current and an output configured to generate a first output current proportional to the first input current, the input of the first current buffer being coupled to the second current path terminal of the first transistor, wherein the first current buffer comprises a first current buffer transistor having a current path that is operatively coupled between the input of the first current buffer and the output of the first current buffer;
a second current buffer having an input configured to receive a second input current and an output configured to generate a second output current proportional to the second input current, the input of the second current buffer being coupled to the second current path terminal of the second transistor, wherein the second current buffer comprises a second current buffer transistor having a current path that is operatively coupled between the input of the second current buffer and the output of the second current buffer; and
a summation node coupled to the outputs of the first and second current buffer.

2. The circuit of claim 1, wherein the first transistor has a first polarity and the second transistor has a second polarity that is opposite the first polarity.

3. The circuit of claim 1, further comprising:
a third transistor having a control terminal and a current path between first and second current path terminals, the control terminal of the third transistor being coupled to the control terminal of the first transistor; and
a fourth transistor having a control terminal and a current path between first and second current path terminals, the first current path terminal of the third transistor coupled to the first current path terminal of the fourth transistor at a second intermediate point and the control terminal of the fourth transistor being coupled to the control terminal of the second transistor.

4. The circuit of claim 3, wherein the first and third transistors have a first polarity and the second and fourth transistors have a second polarity that is opposite the first polarity.

5. The circuit of claim 1, further comprising first and second bias generators active on the current paths of the first and second transistors, wherein the input of the first current buffer is coupled between the first bias generator and the first transistor, and wherein the input of the second current buffer is coupled between the second bias generator and the second transistor.

6. The circuit of claim 1, wherein the first and second current buffer transistors are common gate connected transistors.

7. The circuit of claim 1, wherein the summation node includes a plurality of current mirrors coupled with the outputs of the first and second current buffers.

8. The circuit of claim 7, wherein the current mirrors include diode-connected transistors.

9. A device comprising:
a first transistor having a control terminal and a current path between first and second current path terminals;
a second transistor having a control terminal and a current path between first and second current path terminals, the first current path terminal of the first transistor coupled to the first current path terminal of the second transistor at an intermediate point;
a first current buffer having an input configured to receive a first input current and an output configured to generate a first output current proportional to the first input current, the input of the first current buffer being coupled to the second current path terminal of the first transistor, wherein the first current buffer comprises a first current buffer transistor having a current path that is operatively coupled between the input of the first current buffer and the output of the first current buffer;
a second current buffer having an input configured to receive a second input current and an output configured to generate a second output current proportional to the second input current, the input of the second current buffer being coupled to the second current path terminal of the second transistor, wherein the second current buffer comprises a second current buffer transistor having a current path that is operatively coupled between the input of the second current buffer and the output of the second current buffer;
a summation node coupled to the outputs of the first and second current buffers; and
a sensing capacitor coupled to the intermediate point.

10. The device of claim 9, further comprising a current sense node coupled to an output of the summation node, wherein a current indicative of a value of a charge on the sensing capacitor is available at the current sense node.

11. The device of claim 9, further comprising:
a third transistor having a control terminal and a current path between first and second current path terminals, the control terminal of the third transistor being coupled to the control terminal of the first transistor;
a fourth transistor having a control terminal and a current path between first and second current path terminals, the first current path terminal of the third transistor coupled to the first current path terminal of the fourth transistor at a second intermediate point and the control terminal of the fourth transistor being coupled to the control terminal of the second transistor; and
a second capacitor coupled to the second intermediate point.

12. The device of claim 9, wherein the device is a portion of a touch screen controller.

13. The device of claim 9, further comprising first and second bias generators active on the current paths of the first and second transistors;
wherein the input of the first current buffer is coupled between the first bias generator and the first transistor; and
wherein the input of the second current buffer is coupled between the second bias generator and the second transistor.

14. The device of claim 9, wherein the first and second current buffer transistors are common gate connected transistors.

15. The device of claim 9, wherein the summation node includes a plurality of current mirrors coupled with the outputs of the first and second current buffers.

16. The device of claim 15, wherein the current mirrors include diode-connected transistors.

17. A method of operating the device of claim 9, the method comprising sensing a value of a charge on the sensing capacitor.

18. A circuit, comprising:
a first transistor of a first polarity, the first transistor having a control terminal and a current path between first and second current path terminals;

a second transistor of a second polarity opposite the first polarity, the second transistor having a control terminal and a current path between first and second current path terminals, the first current path terminal of the first transistor coupled to the first current path terminal of the second transistor at a first intermediate point;

a third transistor of the first polarity, the third transistor having a control terminal and a current path between first and second current path terminals, the control terminal of the third transistor being coupled to the control terminal of the first transistor;

a fourth transistor of the second polarity, the fourth transistor having a control terminal and a current path between first and second current path terminals, the first current path terminal of the third transistor coupled to the first current path terminal of the fourth transistor at a second intermediate point and the control terminal of the fourth transistor being coupled to the control terminal of the second transistor;

a first current buffer having an input configured to receive a first input current and an output configured to generate a first output current proportional to the first input current, the input of the first current buffer being coupled to the second current path terminal of the first transistor, wherein the first current buffer comprises a first current buffer transistor having a current path that is operatively coupled between the input of the first current buffer and the output of the first current buffer;

a second current buffer having an input configured to receive a second input current and an output configured to generate a second output current proportional to the second input current, the input of the second current buffer being coupled to the second current path terminal of the second transistor, wherein the second current buffer comprises a second current buffer transistor having a current path that is operatively coupled between the input of the second current buffer and the output of the second current buffer;

a first bias generator having a current path coupled in series with the current paths of the first and second transistors, wherein the input of the first current buffer is coupled between the first bias generator and the first transistor;

a second bias generator having a current path coupled in series with the current paths of the first and second transistors, wherein the input of the second current buffer is coupled between the second bias generator and the second transistor; and a summation node coupled to the outputs of the first and second current buffers.

19. The circuit of claim 18, wherein the first and second current buffer transistors are common gate connected transistors.

20. The circuit of claim 18, wherein the summation node includes a plurality of current mirrors coupled with the outputs of the first and second current buffers.

21. The circuit of claim 20, wherein the current mirrors include diode-connected transistors.

22. The circuit of claim 1, wherein the first current buffer transistor comprises a first current path terminal configured to receive the first input current, and a second current path terminal configured to produce the first output current.

* * * * *